(12) United States Patent
Den Boer

(10) Patent No.: US 8,530,273 B2
(45) Date of Patent: Sep. 10, 2013

(54) METHOD OF MAKING OXIDE THIN FILM TRANSISTOR ARRAY

(75) Inventor: Willem Den Boer, Brighton, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 109 days.

(21) Appl. No.: 12/923,624

(22) Filed: Sep. 29, 2010

(65) Prior Publication Data

US 2012/0074399 A1    Mar. 29, 2012

(51) Int. Cl.
*H01L 21/00*    (2006.01)
*H01L 21/16*    (2006.01)
*H01L 21/84*    (2006.01)

(52) U.S. Cl.
USPC ....... 438/104; 438/85; 438/149; 257/E21.533

(58) Field of Classification Search
USPC ................. 438/85, 104, 149, 754; 257/43, 257/E21.533
See application file for complete search history.

(56) References Cited

U.S. PATENT DOCUMENTS

| | | | |
|---|---|---|---|
| 5,598,285 A | 1/1997 | Kondo et al. | |
| 5,838,037 A | 11/1998 | Masutani et al. | |
| 5,926,702 A | 7/1999 | Kwon et al. | |
| 6,016,178 A | 1/2000 | Kataoka et al. | |
| 6,356,335 B1 | 3/2002 | Kim et al. | |
| 6,362,028 B1 | 3/2002 | Chen et al. | |
| 6,580,093 B2 | 6/2003 | Chung et al. | |
| 6,815,717 B2* | 11/2004 | Horikoshi et al. | 257/64 |
| 6,884,569 B2 | 4/2005 | Nakashima et al. | |
| 7,071,036 B2 | 7/2006 | Yang | |
| 7,408,606 B2 | 8/2008 | Shih | |
| 7,589,799 B2 | 9/2009 | Lai | |
| 7,602,360 B2 | 10/2009 | Park | |
| 8,003,981 B2* | 8/2011 | Iwasaki et al. | 257/43 |
| 2002/0197776 A1* | 12/2002 | Zhang et al. | 438/149 |
| 2003/0160247 A1* | 8/2003 | Miyazawa | 257/79 |
| 2004/0106250 A1* | 6/2004 | Nishihara et al. | 438/230 |
| 2004/0178429 A1* | 9/2004 | Tanaka | 257/288 |
| 2004/0233365 A1* | 11/2004 | Yoshida et al. | 349/123 |
| 2006/0121655 A1* | 6/2006 | Paik | 438/166 |
| 2007/0278490 A1 | 12/2007 | Hirao et al. | |
| 2008/0308826 A1 | 12/2008 | Lee et al. | |
| 2009/0283763 A1 | 11/2009 | Park et al. | |
| 2010/0203673 A1* | 8/2010 | Hayashi et al. | 438/104 |

OTHER PUBLICATIONS

C. Chen, et al., "P-14: AM-OLED Pixel Circuits Based on a-InGaZnO Thin Film Transistors," SID Digest, pp. 1128-1131, 2009.

(Continued)

*Primary Examiner* — Shouxiang Hu
(74) *Attorney, Agent, or Firm* — Nixon & Vanderhye P.C.

(57) ABSTRACT

Certain example embodiments relate to methods of making oxide thin film transistor arrays (e.g., IGZO, amorphous or polycrystalline ZnO, ZnSnO, InZnO, and/or the like), and devices incorporating the same. Blanket layers of an optional barrier layer, semiconductor, gate insulator, and/or gate metal are disposed on a substrate. These and/or other layers may be deposited on a soda lime or borosilicate substrate via low or room temperature sputtering. These layers may be later patterned and/or further processed in making a TFT array according to certain example embodiments. In certain example embodiments, all or substantially all TFT processing may take place at a low temperature, e.g., at or below 150 degrees C., until a post-annealing activation step, and the post-anneal step may take place at a relatively low temperature (e.g., 200-250 degrees C.).

17 Claims, 3 Drawing Sheets

(56) References Cited

OTHER PUBLICATIONS

C. Chen, et al., "Density of States of a-InGaZnO From Temperature-Dependent Field-Effect Studies," IEEE Transactions on Electron Devices, vol. 56, No. 6, pp. 1177-1183, Jun. 2009.

C. Chen, et al., "Amorphous In-Ga-Zn-O Thin Film Transistor Current-Scaling Pixel Electrode Circuit for Active-Matrix Organic Light-Emitting Displays," Japanese Journal of Applied Physics, vol. 48, pp. 03B025-1-03B025-7, 2009.

C. Chen, et al., "a-InGaZnO Thin Film Transistors for AMOLEDs: Electrical Stability and Pixel-Circuit Simulation," Journal of the SID, 17/6, pp. 525-534, 2009.

T. Fung, et al., "P-11: DC/AC Electrical Instability of R.F. Sputter Amorphous In-Ga-Zn-O TFTs," SID Digest, pp. 1117-1120, 2009.

T. Fung, et al., "Electrical Instability of RF Sputter Amorphous In-Ga-Zn-O Thin-Film Transistors," Journal of Display Technology, vol. 5, No. 12, pp. 452-461, Dec. 2009.

T. Fung, et al., "Two-Dimensional Numerical Simulation of Radio Frequency Sputter Amorphous In-Ga-Zn-O Thin-Film Transistors," Journal of Applied Physics, vol. 106, pp. 084511-1-084511-10, 2009.

J. Park, et al., "Self-aligned top-gate amorphous gallium indium zinc oxide thin film transistors," *Applied Physics Letters*, vol. 93, pp. 053501-, 2008.

J. S. Park, et al., "Improvements in the device characteristics of amorphous indium gallium zinc oxide thin-film transistors by Ar plasma treatment," *Applied Physics Letters*, vol. 90, pp. 262106-, 2007.

B. Du Ahn, et al., "Comparison of the effects of Ar and H-2 plasmas on the performance of homojunction amorphous indium gallium zinc oxide thin film transistors," *Applied Physics Letters*, vol. 93, pp. 203506-, 2008.

* cited by examiner

METHOD OF MAKING OXIDE THIN FILM TRANSISTOR ARRAY

FIELD OF THE INVENTION

Certain example embodiments of this invention relate to methods of making oxide thin film transistor arrays, and devices incorporating the same. More particularly, certain example embodiments of this invention relate to oxide (e.g., IGZO) thin film transistor (TFT) arrays deposited using low or room temperature sputtering, and/or methods of making the same. In certain example embodiments, blanket layers of an optional barrier layer, semiconductor, gate insulator, and/or gate metal are disposed on a substrate. These layers may be later patterned and/or further processed in making a TFT array according to certain example embodiments.

BACKGROUND AND SUMMARY OF EXAMPLE EMBODIMENTS OF THE INVENTION

LCD devices are known in the art. See, for example, U.S. Pat. Nos. 7,602,360; 7,408,606; 6,356,335; 6,016,178; and 5,598,285, each of which is hereby incorporated herein in its entirety.

FIG. 1 is a cross-sectional view of a typical LCD display device 1. The display device 1 generally includes a layer of liquid crystal material 2 sandwiched between first and second substrates 4 and 6, and the first and second substrates 4 and 6 typically are borosilicate glass substrates. The first substrate 4 often is referred to as the color filter substrate, and the second substrate 6 often is referred to as the active or TFT substrate.

The first or color filter substrate 4 typically has a black matrix 8 formed thereon, e.g., for enhancing the color quality of the display. To form the black matrix, a polymer, acrylic, polyimide, metal, or other suitable base may be disposed as a blanket layer and subsequently patterned using photolithography or the like. Individual color filters 10 are disposed in the holes formed in the black matrix. Typically, the individual color filters often comprise red 10a, green 10b, and blue 10c color filters, although other colors may be used in place of or in addition to such elements. The individual color filters may be formed photolithographically, by inkjet technology, or by other suitable technique. A common electrode 12, typically formed from indium tin oxide (ITO) or other suitable conductive material, is formed across substantially the entirety of the substrate or over the black matrix 12 and the individual color filters 10a, 10b, and 10c.

The second or TFT substrate 6 has an array of TFTs 14 formed thereon. These TFTs are selectively actuatable by drive electronics (not shown) to control the functioning of the liquid crystal light valves in the layer of liquid crystal material 2. TFT substrates and the TFT arrays formed thereon are described, for example, in U.S. Pat. Nos. 7,589,799; 7,071,036; 6,884,569; 6,580,093; 6,362,028; 5,926,702; and 5,838,037, each of which is hereby incorporated herein in its entirety.

Although not shown in FIG. 1, a light source, one or more polarizers, alignment layers, and/or the like may be included in a typical LCD display device.

Conventional TFT arrays for LCD TVs, monitors, notebook displays, cell phone displays, etc., often are fabricated by first depositing and patterning a gate material and then depositing and patterning, sequentially, the gate insulator, amorphous silicon layer, source/drain metal, passivation layer, and pixel electrode. The manufacturing process involves three physical vapor deposition (PVD) or sputtering steps for the conductors, and several plasma-enhanced combustion vapor deposition (PECVD) steps at an elevated temperature (e.g., at a temperature of at least about 300-350 degrees C.) for the gate insulator, semiconductor, and passivation layers. These deposition processes are interrupted by photolithographic steps for patterning the layers.

It will be appreciated that this current manufacturing flow involves a number of processes, materials, techniques, etc., that often are interrupted by a number of further sub-process steps. In addition, the high temperatures involved in current techniques restrict the types of materials that can be used as the substrates.

Thus, it will be appreciated that there is a need in the art for a simple, low-temperature manufacturing flow for forming a TFT substrate for use in display devices and/or the like.

One aspect of certain example embodiments relates to techniques for providing a simple, low-temperature manufacturing flow for forming a TFT substrate for use in display devices for fabricating the semiconductor, gate insulator, and gate metal layers sequentially as blanket layers.

Another aspect of certain example embodiments relates to disposing blanket layers for the TFT array prior to any patterning steps on the TFT substrate.

Another aspect of certain example embodiments relates to the use of high-throughput, large area coaters. Such equipment may be found, for example, in glass production plants, and may allow for better economies of scale to be achieved.

Certain example embodiments of this invention relate to a method of making a TFT substrate for an electronic device. A glass substrate is provided. An oxide semiconductor blanket layer is sputter deposited, at low or room temperature, directly or indirectly, on the glass substrate. A gate insulator blanket layer is deposited, directly or indirectly, on the oxide semiconductor blanket layer. A gate metal blanket layer is deposited, directly or indirectly, on the gate insulator blanket layer. A mask is applied over one or more portions of the gate metal blanket layer so as to define one or more corresponding masked areas and one or more corresponding unmasked areas. Portions of the gate metal blanket layer and portions of the gate insulator blanket layer are removed at or proximate to the one or more unmasked areas. Conductivity of the oxide semiconductor layer is increased at or proximate to the one or more unmasked areas. A passivation layer is disposed across substantially the entire substrate. The passivation layer is patterned so as to define source and drain contact holes. A layer for source and drain connections is deposited.

Some or all of the above-described steps may be performed at a first location and some or all of the remaining steps may be performed at a second or different location (e.g., after the layer has been shipped to a fabricator, LD manufacturer, etc.). For instance, a first party may perform barrier, oxide semiconductor, gate insulator, and/or gate metal layer depositions, and a second party (e.g., at a second location) may perform patterning, activation, pixel electrode deposition, and/or other steps.

Certain example embodiments of this invention relate to a method of making a TFT substrate for an electronic device. A soda lime glass substrate is provided. An oxide semiconductor layer is sputter deposited, at low or room temperature, directly or indirectly, on substantially an entire major surface of the glass substrate. A gate insulator layer is deposited on substantially the entire major surface of the glass substrate over at least portions of the oxide semiconductor layer. A gate metal layer is deposited, directly or indirectly, on at least portions of the gate insulator layer. The oxide semiconductor layer is patterned prior to deposition of the gate metal layer. Conductivity of portions of the oxide semiconductor layer is increased. A passivation layer is disposed across substantially the entire substrate. The passivation layer is patterned so as to define source and drain contact holes. A layer for source and drain connections is deposited. In certain example embodiments, the patterning of the oxide semiconductor layer is performed prior to deposition of the gate insulator layer. In certain example embodiments, the oxide semiconductor layer and the gate insulator layer are patterned together or at the same or substantially the same time (e.g., in the same step).

A method of making an electronic display device may comprise making a TFT substrate according to this method or a variant thereof. For instance, in the case of an LCD, a color filter substrate may be provided, and a layer of liquid crystal material may be disposed between the color filter substrate and the TFT substrate.

Certain example embodiments of this invention relate to an electronic device including a TFT substrate. The TFT substrate comprises a soda lime glass substrate (e.g., as opposed to a borosilicate glass substrate, which may be used in different embodiments of this invention). A silicon-inclusive barrier layer is sputter deposited at low or room temperature, directly or indirectly, on the soda lime glass substrate (e.g., to help reduce and sometimes even eliminate the migration of sodium from the glass substrate into one or more of the thin film and/or other layers on the substrate). An oxide semiconductor layer comprising IGZO, amorphous or polycrystalline ZnO, ZnSnO, or InZnO, is sputter deposited at low or room temperature, directly or indirectly, on the barrier layer. A gate insulator layer is sputter deposited at low or room temperature, directly or indirectly, on the oxide semiconductor layer. A gate metal layer is sputter deposited at low or room temperature, directly or indirectly, on the gate insulator layer. One or more portions of the gate insulator layer and the gate metal layer are removed to expose the underlying oxide semiconductor layer. One or more portions of the oxide semiconductor layer are removed to create at least one island, the at least one island being plasma treated so as to increase the conductivity thereof. A passivation layer is deposited atop the barrier layer, the at least one island, and the gate insulator layer, the passivation layer being patterned to form source and drain contact holes. Source and drain lines are deposited over at least a portion of the passivation layer and in the source and drain contact holes.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF EXAMPLE EMBODIMENTS OF THE INVENTION

Figure 1:
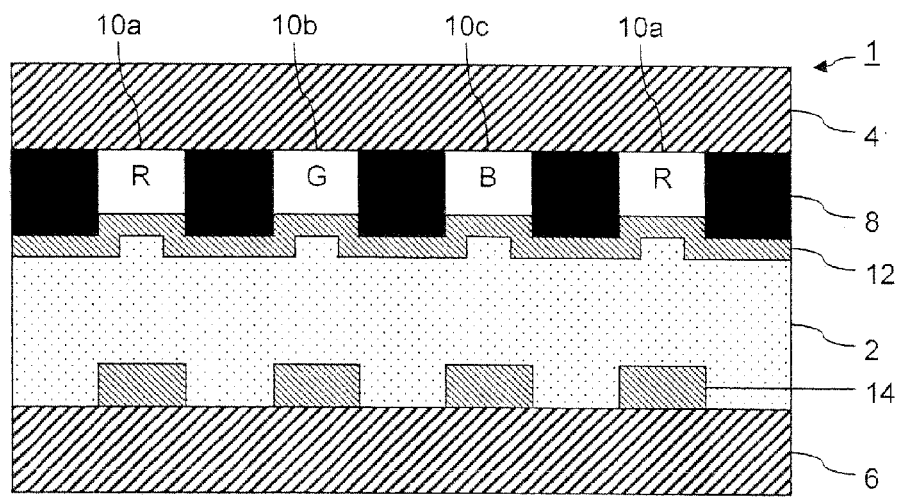
FIG. 1 is a cross-sectional view of a typical LCD display device.

Certain example embodiments relate to complex oxide-based thin film transistors (TFTs) on glass substrates for flat panel displays and the like. In certain example embodiments, the barrier layer, semiconductor layer, gate insulator layer and, optionally, gate metal layer, may be sequentially deposited as blanket layers, e.g., by low or room temperature sputtering prior to any patterning steps for the TFT substrate. These layers for the TFT array therefore may be deposited cost-effectively in large area inline coaters. The layer stacks deposited on the glass add value to the glass substrate, and the example process flows described herein may reduce and sometimes even eliminate the need for customers, such as LCD manufacturers, to invest in, operate, and maintain PECVD equipment for semiconductor and gate insulator deposition.

As indicated above, some a-Si TFT arrays for LCD TVs, monitors, notebook displays, etc., are fabricated by first depositing and patterning a gate metal and then depositing and patterning, sequentially, the gate insulator, amorphous silicon layer, source/drain metal, passivation layer, and pixel electrode. The manufacturing process involves three PVD (typically sputtering) steps for the conductors and several PECVD steps at elevated temperature for the gate insulator, semiconductor, and passivation layers. After deposition, each layer is patterned by photolithography, and only the first layer (the gate metal for a-Si TFT backplanes) is deposited on a substrate without any pattern.

The high performance TFTs of certain example embodiments may be produced using amorphous or polycrystalline oxide semiconductors. Such materials include, for example, indium gallium zinc oxide (IGZO), ZnO, ZnSnO, and/or the like. These wide band gap semiconductor materials may be deposited by DC or RF sputtering at low or room temperature, e.g., on soda lime or borosilicate glass. Gate insulators and gate metals also may be deposited by sputtering in certain example embodiments. The top and bottom gate oxide TFTs will have good performance. The table below compares example a-Si, low temperature polycrystalline silicon (LTPS), and IGZO TFTs.

|  | a-Si TFT | LTPS TFT | IGZO TFT |
| --- | --- | --- | --- |
| Mobility (cm$^2$/Vsec) | 0.5 | 20-100 | 5-50 |
| Deposition Method(s) | PECVD | PECVD + laser annealing | DC sputtering |
| Deposition Temp | 350 degrees C. | 600 degrees C. | Room temperature |
| Highest Process Temp | 350 degrees C. | 600 degrees C. | 250 degrees C. (post-anneal) |
| Process Complexity | Low | High | Low |
| Driver Integration | Partial only | Yes | Yes |
| Scalability | Gen10 | Gen5 | Gen10 |
| Cost | Low | High | Low |

As will be appreciated from the table above, IGZO-based TFTs have better performance than a-Si TFTs currently used in LCD notebooks, monitors and TVs. Their performance is similar to Low Temperature Poly Silicon TFTs, but manufacturing cost is lower and complex oxide TFT processes are scalable to Gen 10 sizes (2.8 m×3 m), or beyond (e.g., to Gen 11 lines where jumbo-sized glass is used). Oxide TFTs also advantageously facilitate the transition to very large LCD and other flat panel designs with high (e.g., 240 Hz and/or beyond) refresh rates, lower cost, and higher brightness, e.g., as a result of the higher mobility of oxide TFTs and their scalable manufacturing. IGZO is generally transparent for visible light and, if transparent conductors are used for gate and source/drain, the entire TFT is generally transparent.

Oxide TFTs also have a large on-off current ratio (>$10^7$). Such factors are desirable, e.g., as other applications become possible.

Oxide TFTs may be used for high-resolution displays and imagers, as they may conduct a high drain current level without the requirement for a large W/L ratio. The low TFT off current allows the possibility of realizing displays with a large gray scale. Moreover, a-IGZO TFTs have a low threshold voltage (<0.2V), which may lead to a low operational power consumption. The steep sub-threshold swing (175 mV/dec) allows a fast switching of the transistor between the on- and off-regimes of operation. Thus, devices including oxide-based TFTs (such as, for example, a-IGZO TFTs) may be suitable for next generation high-resolution AM-OLEDs, AM-LCDs, imagers, and/or the like.

Figure 2:
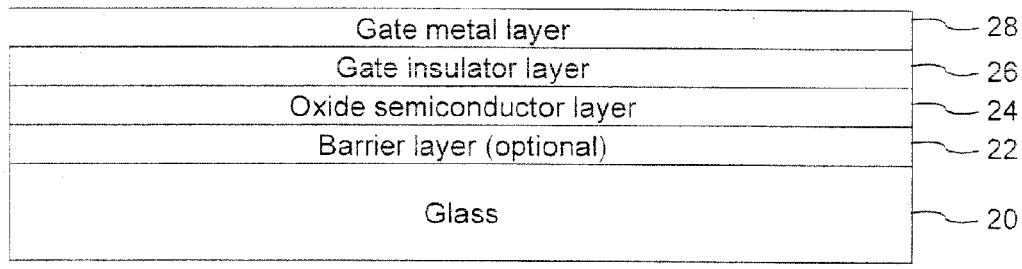
FIG. 2 is a coated article demonstrating an example front-end process for a top gate oxide TFT according to certain example embodiments.

FIG. 2 is a coated article demonstrating an example front-end process for a top gate oxide TFT according to certain example embodiments. An optional barrier layer 22 may be disposed on a substrate 20. The substrate may be a glass substrate such as a soda lime substrate or a borosilicate substrate, e.g., with a thickness ranging from about 0.3 to 1.1 mm. The optional barrier layer 22 may be deposited via sputtering and may be a silicon-inclusive layer such as, for example, SiNx, SiOxNy, SiOx, etc. In certain example embodiments, the optional barrier layer 22 may include small amounts of Al or B, e.g., to help facilitate the sputtering process while still maintaining good sodium blocking capabilities. An oxide semiconductor layer 24 including, for example, IGZO, ZnO (amorphous or polycrystalline), ZnSnO, InZnO, and/or the like, may be disposed, e.g., again via sputtering. In certain example embodiments, the oxide semiconductor may be deposited directly on glass, directly on optional barrier layer, or directly on one or more layers on the glass substrate. In certain example embodiments, IGZO may be deposited via DC sputtering at low or room temperature from a suitable target. Example suitable targets include ceramic targets have equal or substantially equal percentages of In, Ga, and Zn (e.g., 33% each).

The gate insulator layer 26 may then be disposed on the oxide semiconductor layer 24. As above, the gate insulator layer 26 may be a silicon-inclusive layer of or including, for example, $SiO_2$, SiOxNy, SiNx, or it may be an aluminum-inclusive layer such as, for example, $Al_2O_3$, etc., or any suitable combination of these materials. A gate metal layer 28 may be disposed (e.g., deposited via sputtering) on the gate insulator layer 26.

The layers shown in FIG. 2 may in certain example embodiments be sputtered sequentially in line, without breaking vacuum, e.g., in a large area continuous coater with a conveyor to transport the substrates.

The layer stack of FIG. 2 may be used in building self-aligned top gate TFTs according to, for example, the process sequence of FIGS. 3(a)-3(d). The top gate oxide TFTs may have a self-aligned source/drain area in certain example embodiments.

Figure 3A:
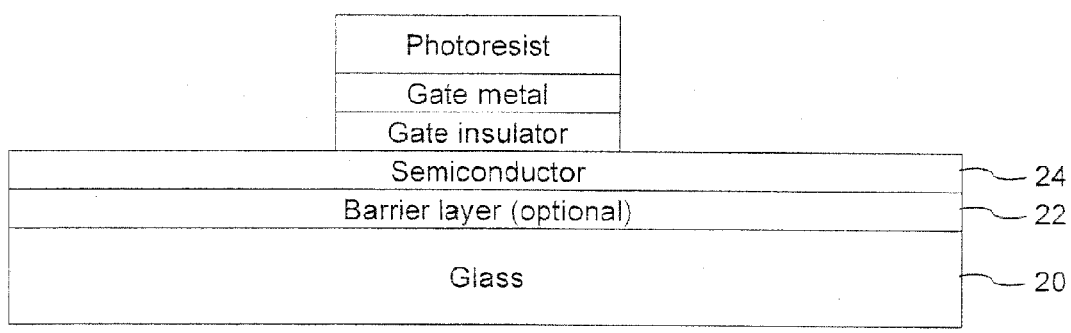
FIGS. 3(a)-3(d) demonstrate how the illustrative layer stack of FIG. 2 may be used to fabricate self-aligned top gate TFTs according to certain example embodiments.

As shown in FIG. 3(a), the gate metal and gate insulator are patterned. This may be accomplished, for example, by applying a photoresist 30 over portions of the substrate, and then using photolithography and dry etching, or a combination of wet etching (e.g., for the metal) and dry etching (e.g., for the gate insulator). The etching may stop at the oxide semiconductor layer 24, such that the gate insulator and gate metal are patterned as 26' and 28'.

Figure 3B:
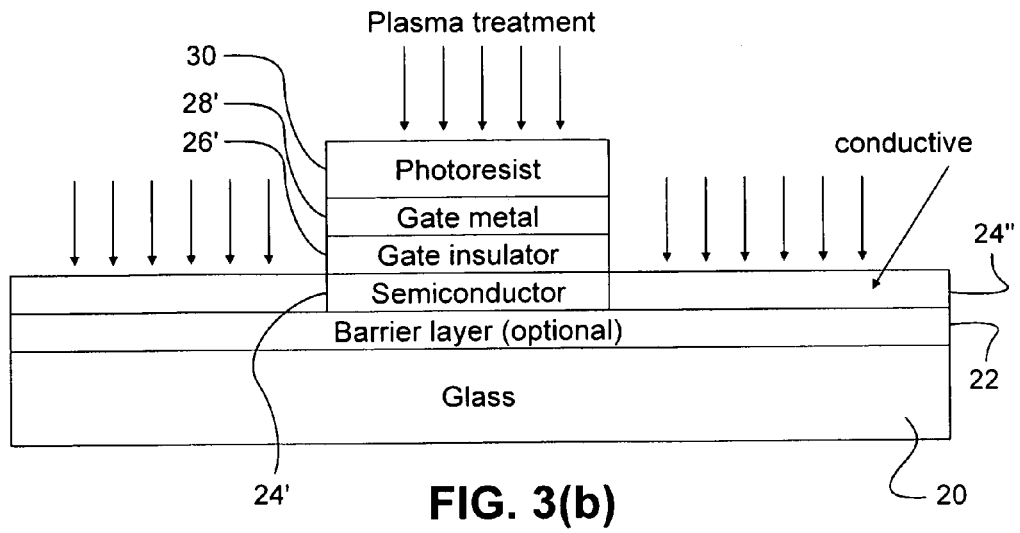

The oxide semiconductor outside the gate area may be exposed to Ar and/or $H_2$ plasma treatment, as shown, for example, in FIG. 3b. This process converts the exposed area (that is not masked by the photoresist 30) into a conductive layer 24", suitable for use as a self-aligned source or drain. The masked area of the semiconductor layer 24' is not exposed to the plasma treatment and thus remains a semiconductor. The photoresist 30 may be removed as a result of, or following, the plasma treatment in different embodiments of this invention.

Figure 3C:
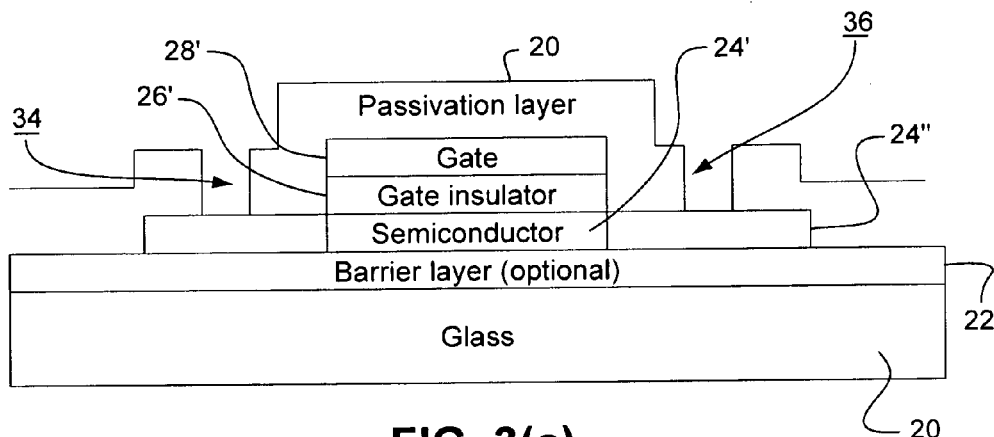

The oxide semiconductors 24" may be patterned into islands for individual TFTs. A passivation layer 32 may be disposed and then patterned. Deposition of the passivation layer 32 may be performed, for example, by PECVD, and the passivation layer may be a silicon-inclusive layer such as, for example, SiNx or $SiO_2$, and/or the like. The patterning of the passivation layer 32 may open up contact holes 34 and 36 in the TFT, e.g., for source and drain and gate areas, respectively. The deposition of the passivation layer 32 is shown in FIG. 3(c) and, as can be seen from this figure, the passivation layer 32 may be disposed over the optional barrier layer 22, the conductive layer 24", and the patterned gate 28'. The passivation layer 32 may be in directly or indirect contact with these and/or other layers in different embodiments of this invention.

Figure 3D:
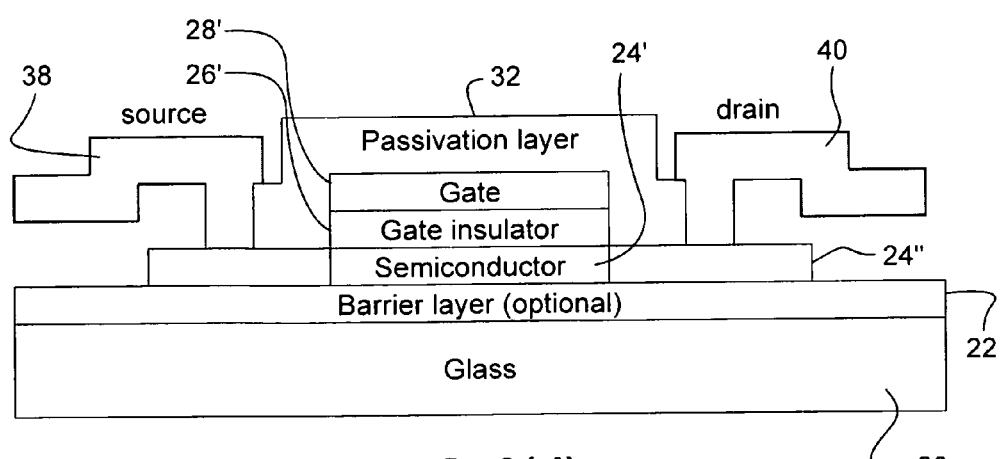

Source and drain metals are then deposited and patterned as shown in FIG. 3(d). The source and drain metals contact the source and drain through the contact holes and creating source and drain contact electrodes 38 and 40. A post-bake step at about 200 degrees C. to about 300 degrees C. may be desirable to help improve TFT performance in terms of mobility, threshold, off-current, and/or the like.

In certain example embodiments, the gate metal need not be deposited in the initial deposition sequence. Rather, in certain example embodiments, the gate metal may be deposited and patterned later in the process. Other process sequences and TFT designs may of course be used in connection with different example embodiments. However, at least some of these designs may begin with a blanket oxide semiconductor layer, e.g., sputtered in a scalable process.

Low or room temperature sputtering may be used to deposit some or all of the above-described and/or other layers in certain example embodiments of this invention. For instance, low or room temperature sputtering may be used to deposit the following layers at the following example thicknesses in order moving away from the substrate:

| Layer | Example Possible Thickness (nm) | Preferred Thickness (nm) | More Preferred Thickness (nm) | Example Thickness (nm) |
|---|---|---|---|---|
| Barrier Layer | 20-150 | 42-58 | 45-55 | 50 |
| IGZO | 20-100 | 34-46 | 36-44 | 40 |
| Gate Insulator | 200-400 | 255-345 | 270-330 | 300 |
| Gate Metal | 100-400 | 170-230 | 180-220 | 200 |

Figure 4:
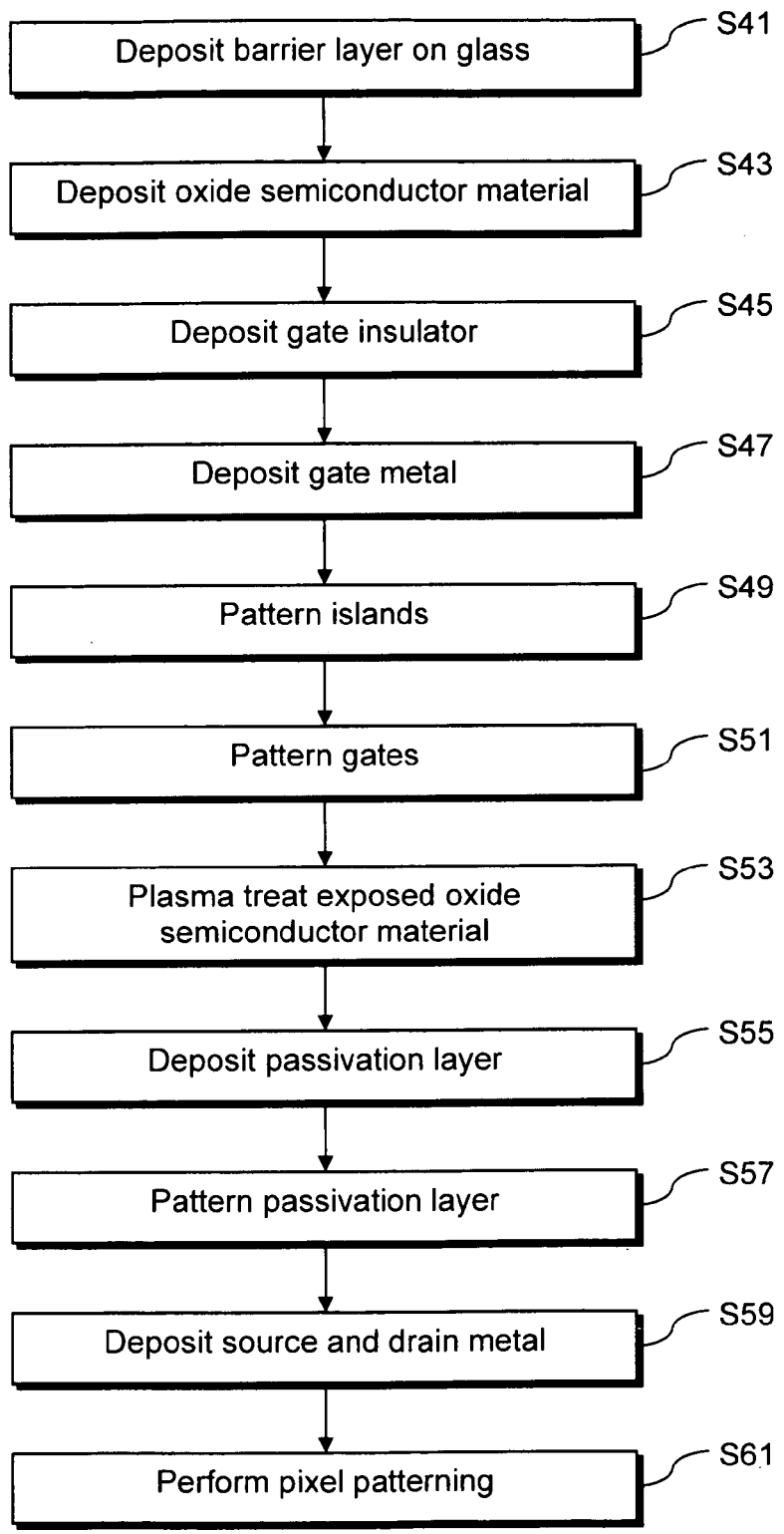
FIG. 4 is a flowchart showing an illustrative process for making an electronic device including a TFT array in accordance with certain example embodiments.

The TFT performance of certain example embodiments may meet or exceed the following values:
Mobility: >5 $cm^2$/Vsec
Threshold voltage: 0 to 5 V
Subthreshold slope: <0.5 V/decade
Off current: <0.1 pA/μm @ Vds=1 V
Stability: Better than a-Si TFTs FIG. 4 is a flowchart showing an illustrative process for making an electronic device including a TFT array in accordance with certain example embodiments. In step S41, an optional barrier layer is blanket deposited on the glass substrate, e.g., by low or room temperature sputtering. In step S43, an oxide semiconductor material (e.g., IGZO, amorphous or polycrystalline ZnO, ZnSnO, InZnO, and/or the like) is blanket deposited, directly or indirectly, on the glass substrate, e.g., by low or room temperature sputtering. In step S45, a gate insulator is blanket deposited, directly or indirectly, on the oxide semiconductor material, e.g., by low or room temperature sputtering. In step S47, a gate metal is blanket deposited, directly or indirectly, on the gate insulator, e.g., by low or room temperature sputtering.

Islands are patterned in the blanket layers in step S49. Gates also are patterned in step S51. The now-exposed oxide semiconductor material is plasma treated (e.g., with H, Ar, or other suitable plasma) to form conductive layers for the source and drain in step S53. A passivation layer is deposited in step S55, and it is patterned in step S57. The source and drain metal (which may be ITO in certain example embodiments) is deposited in step S59. Pixel patterning of the source and drain metal is performed in step S61.

The example process flow shown in FIG. 4 is for a top gate that has a self-aligned source/drain. The small capacitance of the gate drain and gate source (small Cgd and small Cgs) provides less cross-talk and flicker. No short-channel effects are detectable down to L=2 microns. These aspects allow for larger size and/or higher frame rate displays to be manufactured. The blanket IGZO, gate insulator, and/or other depositions are advantageous in terms of ease of manufacturing and scalability.

In certain example embodiments, all or substantially all TFT processing may take place at a low temperature, e.g., at or below about 250 degrees C., more preferably at or below about 200 degrees C., and still more preferably at or below about 150 degrees C., until a post-annealing activation step. Even the post-anneal step may take place at a relatively low temperature (e.g., 200-250 degrees C.), thereby allowing for a broader range of possible substrates. In cases where soda lime glass is used, for example, compaction of the glass substrate prior to TFT processing may not be necessary in certain example embodiments, e.g., by virtue of the global post-anneal taking place at about 200-250 degrees C. after TFT completion. The substrate may be polished in certain example embodiments.

Although certain example embodiments have been described as having top gate TFTs, certain other example embodiments may have bottom gate TFTs. The structure of such example bottom gate TFTs may be staggered, e.g., in terms of gate-source and gate-drain overlap. The gates in such arrangements may be patterned prior to deposition of the oxide semiconductor material in such cases. The oxide semiconductor material may be somewhat thinner in bottom gate TFT embodiments. For instance, when IGZO is used in bottom gate TFT embodiments, the thickness preferably is 15-25 nm, more preferably 17-23 nm, and sometimes about 20 nm, in certain example embodiments. The gate insulator material may be PECVD-deposited SiN or other suitable silicon-inclusive or other material. The passivation layer may involve an optional SiOx/SiNx etch stopper deposited by PECVD or the like, RF sputtered SiOx, DC sputtered AlOx, or other suitable material. Cgs and Cgd for the bottom gate may be larger than the top gate oxide TFT (e.g., because of the gate-source and gate-drain overlap). It will be appreciated that performance (e.g., in terms of mobility) will be good for both top and bottom gate embodiments. Indeed, the performance may be comparable between these two possible designs in different example instances.

Although certain example embodiments have been described as relating to TFTs for LCD devices (such as TVs, monitors, professional displays, cell phones, game devices, etc.), other example embodiments may involve other types of electronic devices, products, and/or intermediate assemblies. For instance, certain example embodiments may be suitable for 3D LCD. Indeed, IGZO TFTs have about 20 times higher mobility than a-Si TFTs, therefore making them more suitable for 3D TV applications. Another example product may involve AMOLED TVs. IGZO TFT stability has been improved to the point where they are suitable as the drive TFT in AMOLED pixels (e.g., for 2D and 3D TV). Other applications are also possible in different embodiments.

Certain example embodiments have been described as involving low or room temperature sputtering. It will be appreciated, however, that "low or room temperature" does not necessarily mean a temperature at or proximate to room temperature. Rather, those skilled in the art recognize that low or room temperature involves temperatures below about 250 degrees C., more preferably below about 200 degrees C., and still more preferably below about 150 degrees C. Low or room temperature sputtering in certain example instances also may be thought of as a sputtering process that where additional heat is not intentionally added during the sputtering process (e.g., via the presence and activation of heaters and/or the like), even though there is a certain amount of heat involved in sputtering.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers therebetween.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making a TFT substrate for an electronic device, the method comprising:
    sputter depositing an oxide semiconductor layer, directly or indirectly, on a soda-lime based glass substrate;
    depositing a gate insulator blanket layer, directly or indirectly, on the oxide semiconductor layer;
    depositing a gate metal blanket layer, directly or indirectly, on the gate insulator blanket layer;
    applying a mask over one or more portions of the gate metal blanket layer so as to define one or more corresponding masked areas and one or more corresponding unmasked areas;
    removing portions of the gate metal blanket layer and portions of the gate insulator blanket layer at or proximate to the one or more unmasked areas;
    increasing conductivity of the oxide semiconductor layer at the one or more unmasked areas then patterning the oxide semiconductor layer into a plurality of islands;
    disposing a passivation layer across substantially the entire substrate;
    patterning the passivation layer so as to define source and drain contact holes;
    depositing a layer for source and drain connections; and
    wherein all TFT processing steps are performed at or below about 150 degrees C., until a post-annealing activation step is performed at 200-250 degrees C.

2. The method of claim 1, wherein the oxide semiconductor layer comprises indium gallium zinc oxide (IGZO).

3. The method of claim 2, wherein the increasing of the conductivity of the oxide semiconductor layer is accomplished via a plasma treatment.

4. The method of claim 3, wherein the plasma treatment is H or Ar plasma treatment.

5. The method of claim 2, further comprising annealing the substrate with the layers formed thereon following deposition of the source and drain connections.

6. The method of claim 1, further comprising depositing a silicon-inclusive barrier layer on and directly contacting the glass substrate.

7. The method of claim 1, wherein the mask is a photoresist.

8. A method of making an electronic display device, the method comprising: making a TFT substrate according to the method of claim 1.

9. The method of claim 8, further comprising:
providing a color filter substrate; and
disposing a layer of liquid crystal material between the color filter substrate and the TFT substrate.

10. The method of claim 1, wherein the oxide semiconductor layer is originally deposited as a blanket layer so as to cover a substantial portion of the glass substrate, and wherein said increasing conductivity of the oxide semiconductor layer is performed on the oxide semiconductor blanket layer, and following said increasing conductivity of the oxide semiconductor blanket layer the oxide semiconductor blanket layer is patterned to form at least a plurality of islands.

11. The method of claim 1, wherein following said increasing conductivity of the oxide semiconductor layer, the oxide semiconductor layer is patterned to form at least a plurality of islands.

12. The method of claim 1, wherein said sputter depositing of the oxide semiconductor layer is at approximately room temperature.

13. A method of making a coated article to be used in the production of a TFT substrate for an electronic device, the method comprising:

sputter depositing, at approximately room temperature, an oxide semiconductor layer, directly or indirectly, on a soda-lime based glass substrate;

depositing a gate insulator layer, directly or indirectly, on the oxide semiconductor layer; and depositing a gate metal layer, directly or indirectly, on the gate insulator layer, wherein:

a mask is applied over one or more portions of the gate metal layer so as to define one or more corresponding masked areas and one or more corresponding unmasked areas, portions of the gate metal layer and portions of the gate insulator layer are to be removed in areas defined by the mask, conductivity of the oxide semiconductor layer is increased at one or more unmasked areas, after increasing conductivity of the oxide semiconductor layer, patterning the oxide semiconductor layer into a plurality of islands;

a passivation layer is disposed across at least a substantial portion of the substrate, the passivation layer is patterned so as to define source and drain contact holes, a layer for source and drain connections is deposited; and wherein all TFT processing steps are performed at or below about 150 degrees C. until a post-annealing activation step is performed at 200-250 degrees C.

14. The method of claim 13, wherein the oxide semiconductor material comprises indium gallium zinc oxide (IGZO).

15. The method of claim 13, further comprising depositing a silicon-inclusive barrier layer on and directly contacting the glass substrate.

16. The method of claim 13, wherein the conductivity of the oxide semiconductor layer is increased via H plasma treatment.

17. The method of claim 13, wherein the conductivity of the oxide semiconductor layer is increased via Ar plasma treatment.

* * * * *